United States Patent
Mahvan et al.

(10) Patent No.: US 6,452,765 B1
(45) Date of Patent: Sep. 17, 2002

(54) CONBTI AS HIGH RESISTIVITY SAL MATERIAL FOR HIGH-DENSITY MR

(75) Inventors: Nader Mahvan, Cupertino; Sukesh Mahajan; Raman Basi, both of Fremont, all of CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/195,475

(22) Filed: Nov. 18, 1998

(51) Int. Cl.$^7$ .................................................. G11B 5/39
(52) U.S. Cl. ................................................... 360/327.22
(58) Field of Search .............................. 360/327.3, 325, 360/327.22, 327.1–327.2

(56) References Cited

U.S. PATENT DOCUMENTS

| | | | |
|---|---|---|---|
| 4,771,349 A | 9/1988 | Tsang | 360/113 |
| 4,836,865 A * | 6/1989 | Sakakima et al. | 148/306 |
| 4,994,320 A * | 2/1991 | Jagielinski | 428/336 |
| 5,034,285 A * | 7/1991 | Satomi et al. | 428/692 |
| 5,147,732 A | 9/1992 | Shiroishi et al. | 428/668 |
| 5,227,193 A * | 7/1993 | Hori et al. | 427/131 |
| 5,327,313 A | 7/1994 | Nishioka et al. | 360/113 |
| 5,429,731 A * | 7/1995 | Osano et al. | 204/192.2 |
| 5,434,826 A | 7/1995 | Ravipati et al. | 367/140 |
| 5,495,378 A | 2/1996 | Bonyhard et al. | 360/113 |
| 5,554,265 A | 9/1996 | Bonyhard et al. | 204/192.35 |
| 5,646,805 A | 7/1997 | Shen et al. | 360/113 |
| 5,673,162 A | 9/1997 | Saito | 360/113 |
| 5,694,275 A | 12/1997 | Wantanabe et al. | 360/113 |
| 5,715,120 A | 2/1998 | Gill | 360/113 |
| 5,717,550 A | 2/1998 | Nepela et al. | 360/113 |
| 5,748,413 A | 5/1998 | Lederman et al. | 360/113 |
| 5,748,416 A | 5/1998 | Tobise et al. | 360/113 |
| 5,808,843 A * | 9/1998 | Kobayashi et al. | 360/327.31 |
| 5,838,154 A * | 11/1998 | Morikawa et al. | 324/249 |
| 5,892,641 A * | 4/1999 | Ishiwata | 360/113 |
| 6,124,047 A * | 9/2000 | Hasegawa | 428/692 |

FOREIGN PATENT DOCUMENTS

JP 63081614 * 4/1988

* cited by examiner

Primary Examiner—David Hudspeth
Assistant Examiner—Angel Castro
(74) Attorney, Agent, or Firm—Carr & Ferrell LLP

(57) ABSTRACT

A soft adjacent layer made from a ternary alloy material and a MR sensor utilizing this soft adjacent layer. The ternary alloy material CoXY includes cobalt (Co), a first transition metal X and a second transition metal Y. In a preferred embodiment, X is niobium (Nb) and Y is titanium (Ti) so that the resulting ternary alloy material is CoNbTi. Alternatively, X and Y may be any transition metals such that the resulting ternary alloy material CoXY exhibits properties similar to CoNbTi. The high-density MR sensor of the present invention includes a SAL made from the ternary alloy material, a MR layer and a non-magnetic spacer sandwiched between the SAL and MR layer.

6 Claims, 2 Drawing Sheets

CONBTI AS HIGH RESISTIVITY SAL MATERIAL FOR HIGH-DENSITY MR

BACKGROUND OF THE INVENTION

1. Field of the Invention

The present invention relates in general to magneto-resistive heads and more particularly to a soft adjacent layer made from a ternary alloy material and an anisotropic magneto-resistive sensor that utilizes this soft adjacent layer. The soft adjacent layer of the present invention is a ternary alloy material including CoXY, where Co is cobalt, X is a first transition metal and Y is a second transition metal. In a preferred embodiment, the first transition metal is niobium (Nb) and the second transition metal is titanium (Ti) so that resulting ternary alloy material is cobalt-niobium-titanium (CoNbTi). Alternatively, X and Y may be any transition metals such that the resulting ternary alloy CoXY exhibits properties similar to CoNbTi.

2. Background Art

Anisotropic magneto-resistive (MR) sensors are used in numerous devices for reading signals recorded on a magnetic storage medium. For example, MR sensors are widely used in computers as read sensors in high-capacity hard drives and other types of magnetic storage media. Even though current hard drives can store large amounts of data, there are in development hard drives with even greater storage capabilities. Existing MR sensors, however, are inadequate to read the higher-density storage media of these next generation hard drives. Therefore, as more data is packed onto these magnetic storage media, there is a need for higher-density anisotropic MR sensors capable of reading this data.

Anisotropic MR sensors utilize the anisotropic magneto-resistive (AMR) effect to detect signals recorded on a magnetic storage medium through the resistance change in a material as a function of the amount and direction of magnetic flux. The basic AMR effect states that the electrical resistance of a MR material changes in the presence of a magnetic field. FIG. 1. illustrates the AMR effect in a thin-film strip of MR material. Typically, this thin-film strip, known as a MR layer 100, is contained on a MR sensor. The thickness of the MR layer 100 is thin enough that the resistance of the MR layer 100 varies as $\cos^2\theta$, where $\theta$ is known as the magnetization angle. As shown in FIG. 1, $\theta$ is the angle between the magnetization vector M of the MR layer 100 and the direction of the current I flowing through the MR layer 100. The resistance of the MR layer 100 is given as:

$$R = R_0 + \Delta R \cos^2\theta$$

where $R_0$ is the fixed part of the resistance and $\Delta R$ is the maximum value of the variable part of the resistance.

The fundamental idea behind the MR sensor is that the signal produced by the tape, disk, or other magnetic storage media rotates the magnetization vector M of the MR layer 100. When the magnetization angle $\theta$ is properly biased with a bias field, any small changes in resistance are almost directly proportional to the signal produced by the storage medium. In turn, this resistance change is transformed into a voltage signal by passing the current I through the MR layer 100. In order to have a nearly linear response from the MR layer 100, it is important that the magnetization vector M be properly biased so that the magnetization angle $\theta$ is 45 degrees.

In general, the magnetization angle $\theta$ is biased at 45 degrees by using two bias fields, longitudinal and transverse bias. The preferred technique for transverse biasing MR sensors is by soft adjacent layer (SAL) biasing. One reason SAL biasing for MR sensors is the preferred technique is that SAL biasing is relatively easy to fabricate and work with and uses well-known thin-film techniques. Another reason is that efforts to increase recording density require that the recording tracks be narrower and the linear recording density along each track be increased. The small MR layers that are necessary to achieve these requirements are particularly well-suited for SAL biasing.

FIG. 2 illustrates a conventional SAL biasing arrangement. In particular, the tri-layer thin-film stacked structure 200 includes the MR layer 205, a spacer 210 and the SAL 220. The spacer 210 is made of a non-magnetic material of high-resistivity and is sandwiched between the MR layer 205 and the SAL 220 to prevent magnetic exchange coupling. In addition, the spacer 210 electrically insulates the MR layer 205 from the SAL 220. In a typical tri-layer structure, the spacer 210 is made from tantalum (Ta), the MR layer is any one of various types of permalloy consisting generally of 81% nickel (Ni) and 19% iron (Fe), and the SAL 220 is made from one of several materials including permalloy and ternary alloys containing nickel-iron (NiFe) and a third element selected from rhodium (Rh), ruthenium (Ru), titanium (Ti), chromium (Cr), iridium (Ir) or niobium (Nb).

In order to operate the tri-layer structure 200 in a MR sensor a sense current Is is applied to the MR layer 205 from a current source. Due to the SAL sense current shunting effect, however, only of a portion of the sense current $I_S$ flows through the electrically conductive MR layer 205, as represented by $I_{S205}$. The SAL sense current shunting effect is a major disadvantage in SAL biasing. This inherent shunting occurs when the fill sense current $I_S$ is shunted away from the MR layer 205 into the SAL 220. In existing MR sensors, the sense current $I_S$ is divided among the tri-layer structure 200 as follows: a great majority of $I_S$ goes to the MR layer, a considerable amount goes to the SAL and a negligible amount goes to the spacer. Shunting of the sense current $I_S$ from the MR layer 205 is undesirable because in general the higher the current through the MR layer 205 the higher the amplitude and the magneto-resistive effect of the MR sensor. This, in turn, contributes to higher-density MR sensors. Thus, it is highly desirable to decrease the shunting effect and increase the sense current through the MR layer.

One way to decrease the shunting effect is to increase the resistivity of the SAL material. In particular, the higher the resistivity of the SAL material the less sense current will be shunted through the SAL and the more current will flow through the MR layer. However, simply increasing the resistivity of the SAL is not enough. In order to be useful as a SAL, a SAL material must possess other desirable characteristics besides high resistivity. Specifically, a SAL material exhibit the following properties:

a. high permeability and low coercivity: This permits the SAL material to switch easily to its non-magnetic state and not retain any magnetic field even after be magnetically saturated;

b. low interdiffusion between layers and high stability over time: Because the SAL is in close proximity to other materials and layers in the tri-layer structure, it is important that the SAL material not interdiffuse into the other layers. Moreover, the SAL material should be stable over time to ensure a prolonged existence;

c. low magnetostriction: Magnetostriction is the phenomenon in which a magnetic material changes its size depending on its state of magnetization. Low magnetostriction is desirable in a SAL because with low magnetostriction the SAL does not alter its magnetization properties when the SAL goes through the device fabrication process;

d. high corrosion resistance: Because many chemicals are used in the fabrication process, it is important that the SAL material have high corrosion resistance. In particular, cobalt (Co) has a high tendency to corrode, and therefore it is typically quite difficult to find a SAL material made from a Co alloy that has a high corrosion resistance;

e. high saturation magnetization: This property is needed so that the SAL can properly bias the MR layer. For optimal performance of the MR sensor, the SAL should be operated in a magnetically saturated state, and a high saturation magnetization helps achieve this requirement.

Therefore, there exist a need for a SAL material exhibiting the property of high-resistivity so that the SAL sense current shunting effect will be greatly reduced and more sense current will flow through the MR layer. In addition, this SAL material should exhibit other favorable properties such as high permeability, low coercivity, low magnetostriction, high corrosion resistance and high saturation magnetization. A SAL material exhibiting these properties would contribute to greater amplitude and increased magneto-resistive effect in MR sensors utilizing this material. The resulting high-density MR sensor would be able to read the high-density magnetic storage media of the next generation.

Whatever the merits of existing SAL materials and anisotropic MR sensors utilizing existing SAL materials, they do not achieve the benefits of the present invention.

SUMMARY OF THE INVENTION

To overcome the limitations in the prior art as described above and other limitations that will become apparent upon reading and understanding the present specification, the present invention includes a SAL made from a ternary alloy material and an anisotropic magneto-resistive sensor utilizing this SAL. The ternary alloy material includes CoXY, where X is a first transition metal and Y is a second transition metal. In a preferred embodiment, the first transition metal is Nb and the second transition metal is Ti, so that the resulting ternary alloy material is CoNbTi. Alternatively, X and Y may be any transition metals such that the resulting ternary alloy CoXY exhibits properties similar to CoNbTi.

It is a discovery of the present invention that a SAL material of cobalt-niobiumtitanium (CoNbTi) exhibits all the favorable properties of a desired SAL material including a high resistivity. Moreover, the SAL made from CoNbTi is particularly useful in reducing the SAL sense current shunting effect. A MR sensor having a SAL made from this ternary alloy material provides the MR layer with increased sense current. This decrease in the shunting effect contributes to the MR sensor of the present invention having greater amplitude, increase magneto-resistive effect and higher density than existing MR sensors.

In a preferred embodiment, the invention includes a SAL made from a ternary alloy material containing between about 80 and 90 percent cobalt (Co), between about 5 and 10 percent niobium (Nb) and between about 5 and 10 percent of titanium (Ti). The resulting CoNbTi preferably has a high resistivity of at least 90 microOhms·cm. Moreover, the CoNbTi preferably has a saturation magnetization of between approximately 10,000 and 11,500 Gauss. It is a discovery of this invention the ternary alloy material of CoNbTi contains all of these preferred properties as well as the desirable SAL properties listed above.

In an alternative embodiment, the ternary alloy material includes CoXY, where Co is cobalt, X is a first transition metal and Y is a second transition metal. In this embodiment, X and Y may be any transition metals such that the resulting ternary alloy material CoXY exhibits properties similar to CoNbTi.

The present invention is also embodied in a anisotropic MR sensor that uses a SAL made from the ternary alloy material of the present invention. In a preferred embodiment, the MR sensor includes a substrate and a tri-layer thin-film structure including a SAL overlying the substrate, a non-magnetic spacer overlying the SAL and a MR layer overlying the spacer. The spacer is positioned such that it is sandwiched between the SAL and MR layer. In addition, the MR sensor may include a tantalum (Ta) cap overlying the MR layer. Moreover, the MR sensor may include electrical connections so that an electric current is able to flow through the MR layer.

Other aspects and advantages of the present invention as well as a more complete understanding thereof will become apparent from the following detailed description, taken in conjunction with the accompanying drawings, illustrating by way of example the principles of the invention. Moreover, it is intended that the scope of the invention be limited by the claims and not the preceding summary or the following detailed description.

BRIEF DESCRIPTION OF THE DRAWINGS

Referring now to the drawings in which like reference numbers represent corresponding parts throughout.

DETAILED DESCRIPTION OF THE PREFERRED EMBODIMENT

Figure 1:
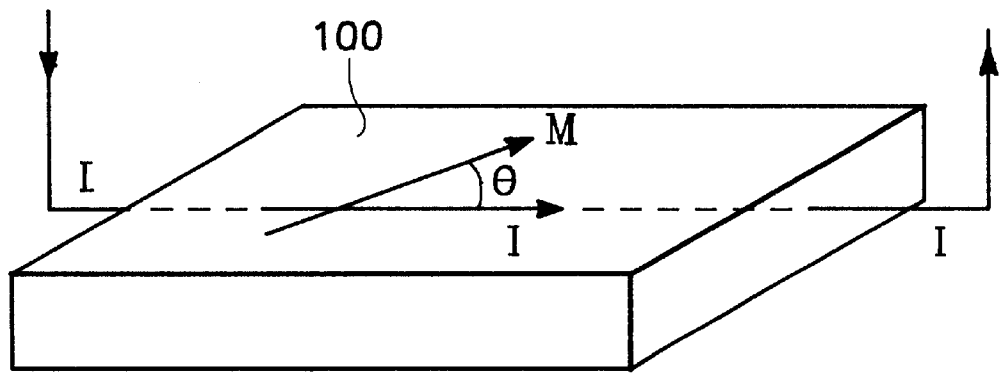
FIG. 1 illustrates the anisotropic magneto-resistive (AMR) effect, depicted in a MR layer.

In the following detailed description of the preferred embodiment, reference is made to the accompanying drawings in which is shown by way of illustration a specific embodiment whereby the invention may be practiced. It is to be understood that other embodiments may be utilized and structural and functional changes may be made without departing from the scope of the present invention.

As shown in the drawings for purposes of illustration, the present invention is embodied in a SAL made from a ternary alloy material and a MR sensor using this SAL. The ternary alloy material includes CoXY, where X is a first transition metal and Y is a second transition metal. Preferably, X is Nb and Y is Ti so that the resulting ternary alloy material is CoNbTi, which exhibits a high resistivity as well as several other desirable properties of a SAL material as listed above. Alternatively, X and Y may be any transition metals such that the resulting ternary alloy material CoXY exhibits properties similar to CoNbTi.

Although current SAL materials are sufficient in existing MR sensors, the next generation of MR heads will require higher amplitude and density. One way to obtain this is by reducing the SAL sense current shunting effect. The SAL made from the ternary alloy material of the present invention has a high-resistivity and can greatly reduce the SAL sense current shunting effect. Further, the SAL material of the present invention, and especially CoNbTi, exhibits favorable SAL properties including high permeability, low coercivity, low interdiffusion between layers, stability over time, low magnetostriction, high corrosion resistance and high saturation magnetization. The higher resistivity of this new SAL means that a MR sensor using the SAL of the present invention has greater amplitude and greater sensitivity than existing MR sensors. This greater amplitude and sensitivity is required for high-density MR sensors.

Figure 2:
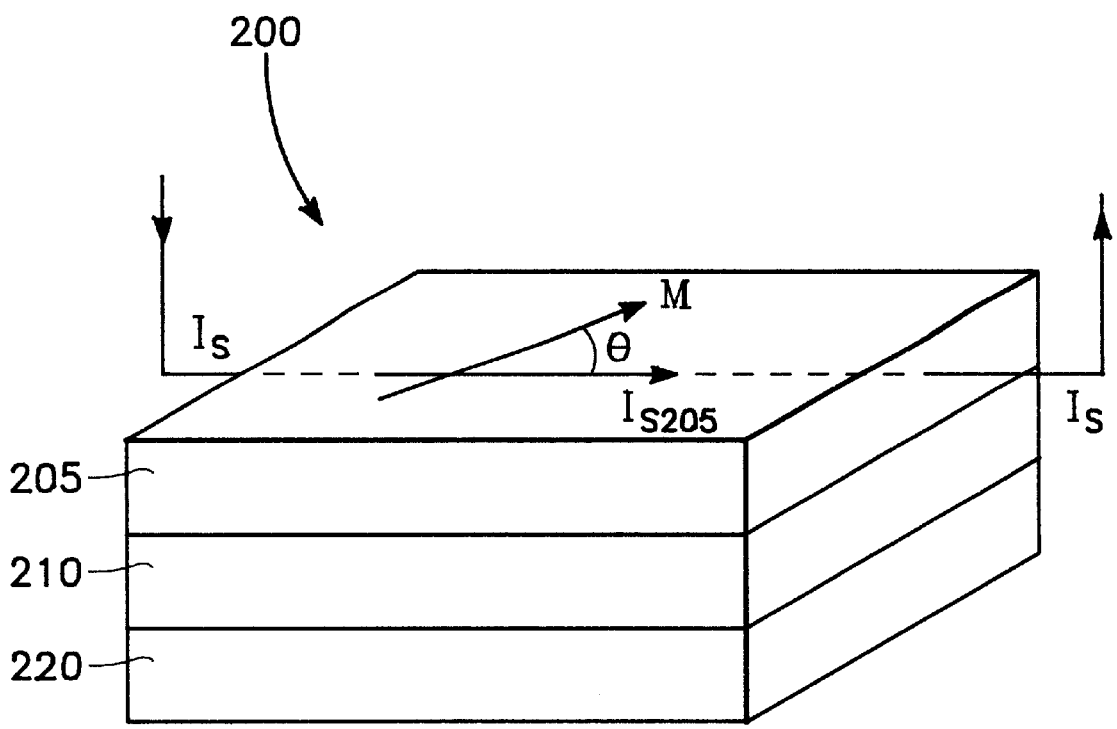
FIG. 2 illustrates a SAL biasing arrangement including a tri-layer thin-film stacked structure.

Referring again to FIG. 2, a SAL biasing arrangement having a tri-layer stacked structure 200 is shown. The SAL 220 is a part of the tri-layer structure 200 and is made from a ternary alloy material including CoXY. X is a first transition metal and Y is a second transition metal. In a preferred embodiment, X is Nb and Y is Ti so that the resulting ternary alloy material is CoNbTi. This material, CoNbTi, exhibits all the favorable SAL properties discussed previously. Alternatively, X and Y may be any transition metals as long as the resulting CoXY material exhibits favorable properties similar to CoNbTi.

These favorable properties include a high resistivity and a high saturation magnetization. Moreover, a SAL material must also exhibit other desirable properties or else it may be unsuitable for use as a SAL. In particular, among other properties, the material should possess good corrosion resistance, stability over time, thermal stability and low interdiffusion among the layers of the tri-layer stacked structure. It is a discovery of the present invention that CoNbTi is particularly well-suited for use as a SAL material because CoNbTi exhibits the above favorable properties of a SAL material in addition to its high resistivity, low magnetostriction and high saturation magnetization.

The preferred ternary alloy material of the present invention is made by combining between about 80 and 90 percent by atomic weight of Co, between about 5 and 10 percent by atomic weight of Nb and between 5 and 10 percent of Ti. It has been found that resulting ternary alloy material of CoNbTi has a resistivity of about 100 microOhms·cm and a saturation magnetization as high as 11,500 Gauss. In comparison, existing prior art SAL materials, such as nickel-iron-rhodium (NiFeRh) and nickel-iron-rhenium (NiFeRe), have a resistivity of about 60 microOhms·cm and a saturation magnetization of about 8,500 Gauss. Thus, compared to existing prior art SAL materials, CoNbTi has about a 40 percent higher resistivity and about a 25 percent higher saturation magnetization.

Figure 3:
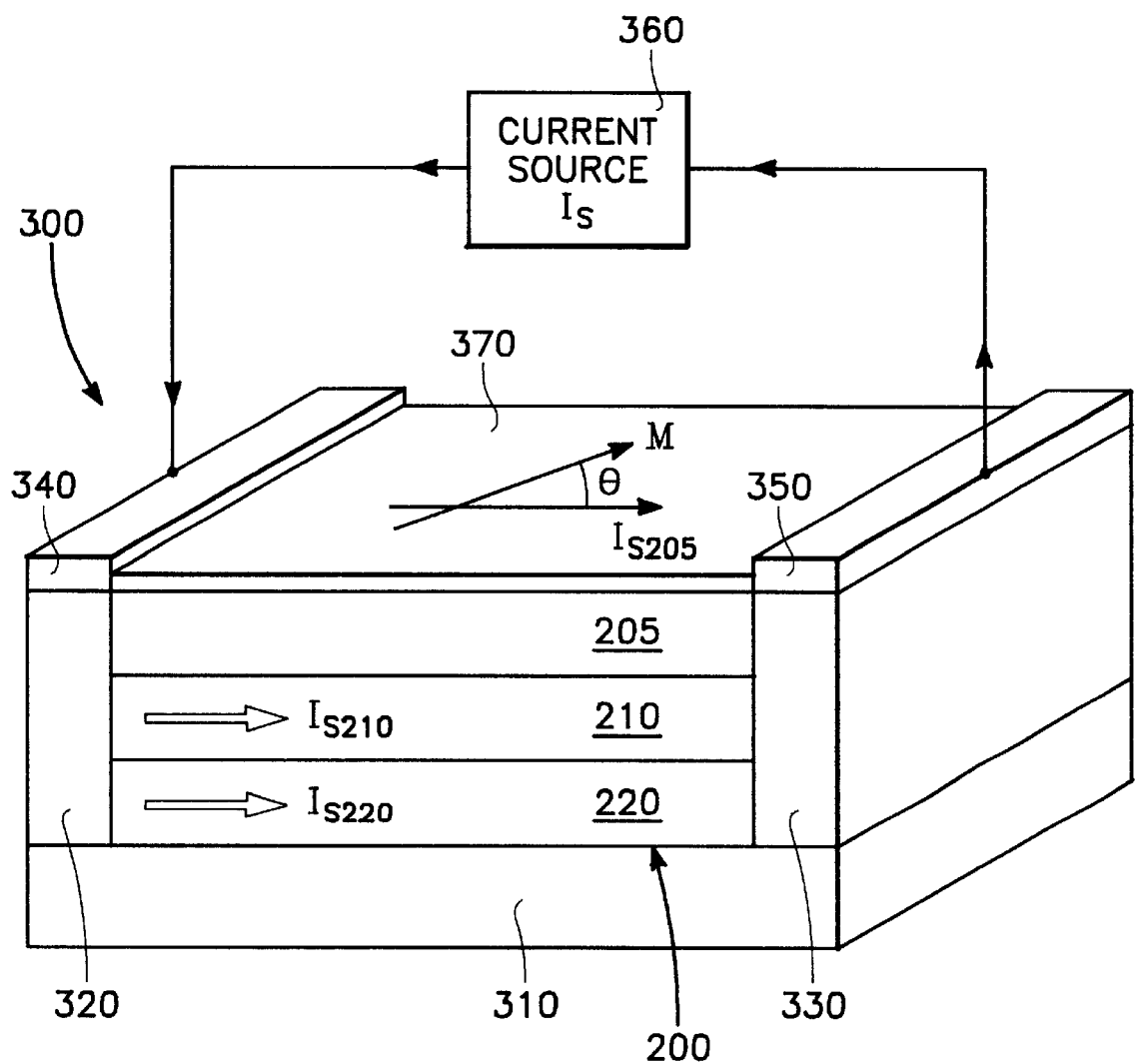
FIG. 3 illustrates the anisotropic MR sensor of the present invention having a SAL made from the SAL ternary alloy material of the present invention.

FIG. 3 illustrates an anisotropic MR sensor 300 including the tri-layer structure 200 disposed over a substrate 310. The end regions of the MR sensor 300 include hard bias layers 320 and 330 that adjoin the ti-layer structure 200. The tri-layer structure 200 includes the MR layer 205, the spacer 210 and the SAL 220. Preferably, the SAL is made from CoNbTi, but may be CoXY as described above. Electrical connections 340 and 350 are formed over the hard bias layers 320 and 330 so that a sensing current $I_S$ is able to flow from a current source 360 to the MR layer 205. Moreover, a cap 370 overlies the MR layer 205 and serves to protect the MR sensor 300. Typically, the 370 is made of tantalum (Ta).

As discussed above, due to the SAL sense current shunting effect, the full amount of the sensing current $I_s$ does not flow through the MR layer 205. As illustrated in FIG. 3, $I_{S205}$ flows through the MR layer 205, $I_{S210}$ flows through the spacer 210, and $I_{S220}$ flows through the SAL, so that $I_{S210} < I_{S220} < I_{S205} < I_S$. Generally, $I_{S210}$ is negligible due to the extremely high resistivity of the spacer material. However, in existing SAL materials, $I_{S220}$ represents a substantial amount of the sense current Is flowing through the SAL 220 and diverted from the MR layer 205 due to the SAL sense current shunting effect. The SAL material of the present invention, however, considerably reduces the current $I_{S220}$ in the SAL.

From the foregoing it will be appreciated that the SAL made from a ternary alloy material, preferably CoNbTi, offers numerous advantages. Namely, the SAL material of the present invention has a higher resistivity and higher saturation magnetization than prior art SAL materials. Moreover, the MR sensor of the present invention utilizing this SAL material has increased amplitude and increased sensitivity over prior art MR sensors. Both of these properties contribute to higher density in an MR sensor.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A magneto-resistive sensor, comprising:
   a magneto-resistive layer;
   a soft adjacent layer including a CoNbTi ternary alloy material having
      between about 80 and 90 percent by atomic weight of cobalt,
      between about 5 and 10 percent by atomic weight of niobium, and
      between about 5 and 10 percent by atomic weight of titanium; and
   a non-magnetic spacer layer disposed between the soft adjacent layer and the magneto-resistive layer.

2. The invention as set forth in claim 1, wherein the ternary alloy material has a resistivity of at least approximately 90 microOhms·cm.

3. The invention as set forth in claim 1, wherein the ternary alloy material has a resistivity of between 90 and 120 microOhms·cm.

4. The invention as set forth in claim 1, wherein the ternary alloy material has a saturation magnetization of between approximately 10,000 to 11,500 Gauss.

5. The invention as set forth in claim 1, further comprising electrical connections whereby an electric current is able to flow through the magneto-resistive layer.

6. The invention as set forth in claim 5, further comprising a thin-film cap disposed over the magneto-resistive layer.

* * * * *